United States Patent [19]

Fry et al.

[11] Patent Number: 4,885,573
[45] Date of Patent: Dec. 5, 1989

[54] DIAGNOSTIC SYSTEM FOR COMBUSTION CONTROLLER

[75] Inventors: John J. Fry; George Hall, II, both of Wickliffe; Robert A. Smith, Mentor, all of Ohio

[73] Assignee: Gas Research Institute, Chicago, Ill.

[21] Appl. No.: 84,689

[22] Filed: Aug. 12, 1987

[51] Int. Cl.[4] ............................................. G08B 23/00
[52] U.S. Cl. .................................... 340/519; 340/500; 340/501; 340/511; 340/525; 431/13; 431/18; 374/144
[58] Field of Search ................ 340/519, 500, 501, 506, 340/511, 520, 521, 525, 537, 588, 870.04, 870.16; 431/13, 18; 374/144

[56] References Cited

U.S. PATENT DOCUMENTS

| | | | |
|---|---|---|---|
| 4,464,653 | 8/1984 | Winner | 340/501 |
| 4,538,138 | 8/1985 | Harvey et al. | 340/518 |
| 4,543,567 | 9/1985 | Shirata et al. | 340/519 |

Primary Examiner—Donnie L. Crosland
Attorney, Agent, or Firm—Thomas W. Speckman; Douglas H. Pauley

[57] ABSTRACT

A combustion control system includes a sensor assembly and a process controller, the sensor assembly including sensors for providing output signals indicative of process variables, the process controller responding to the output signals to maintain a desired operation of the process. The process controller continuously monitors parameters of the sensors and provides alarms whenever any of these parameters deviate from setpoint values, the process controller automatically prioritizing these alarms to provide a display of only the most relevant alarms. A housing enclosing the processor controller provides RFI/EMI shielding of the process controller including the attenuation and absorption of the EMI/RFI energy.

11 Claims, 9 Drawing Sheets

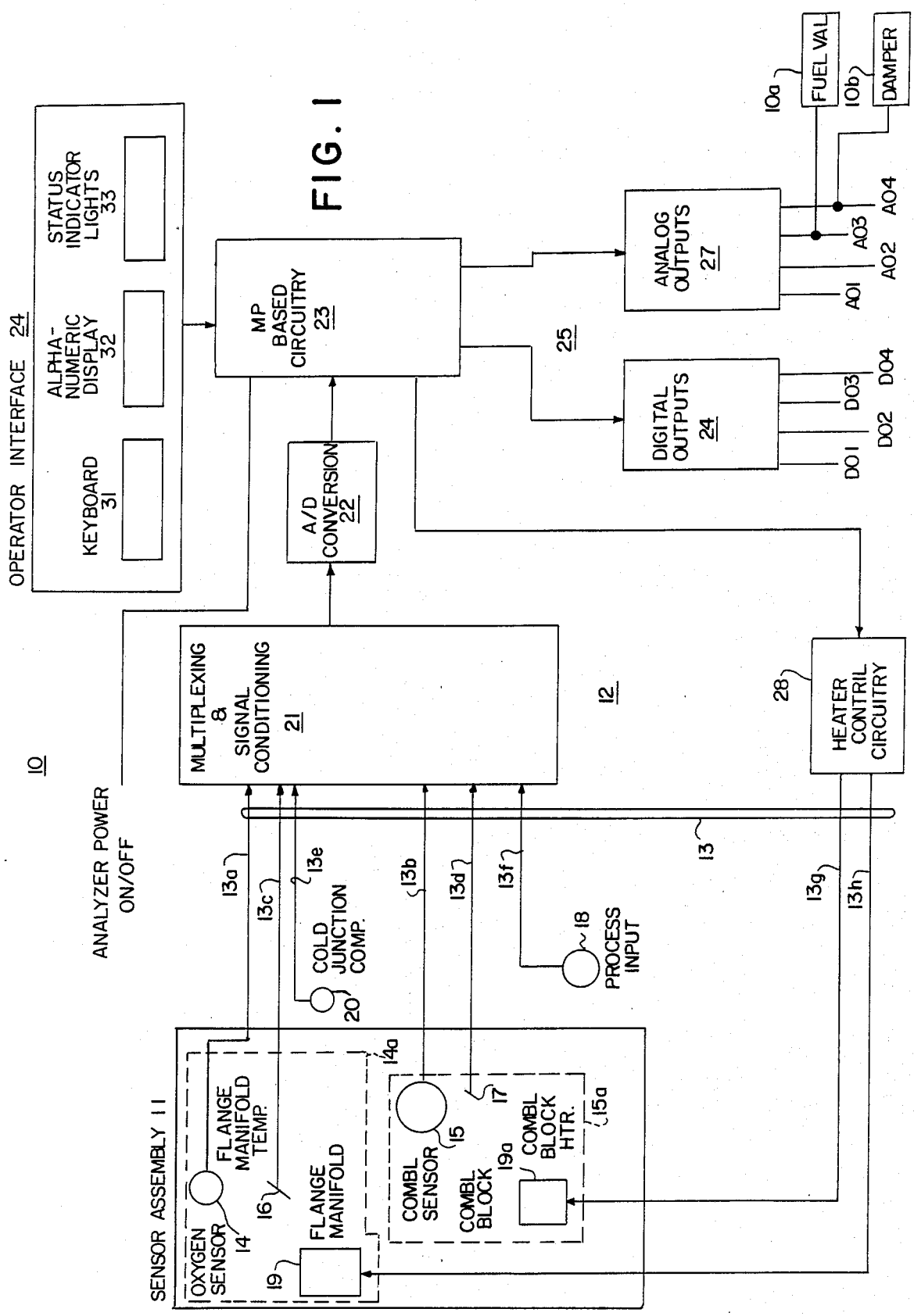

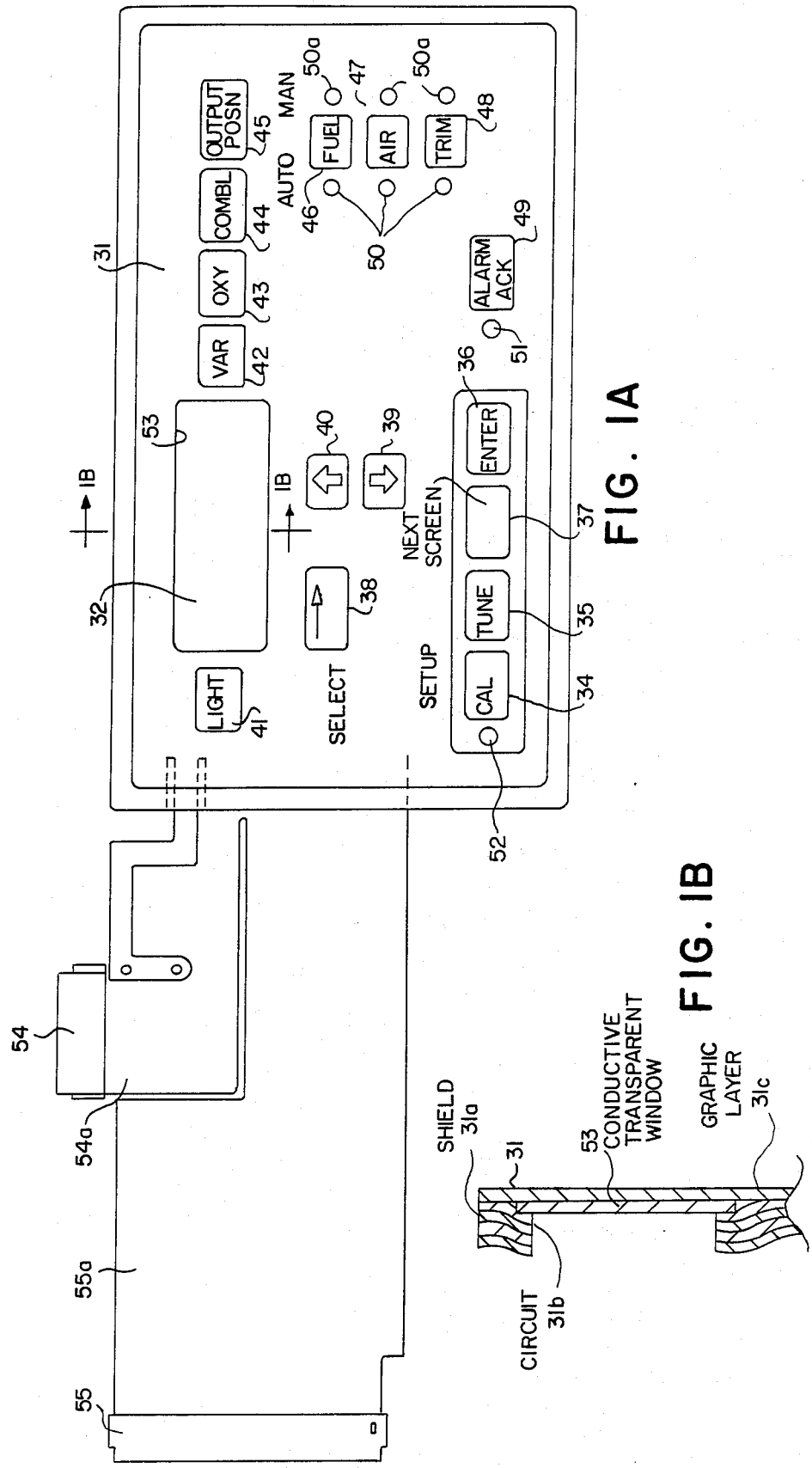

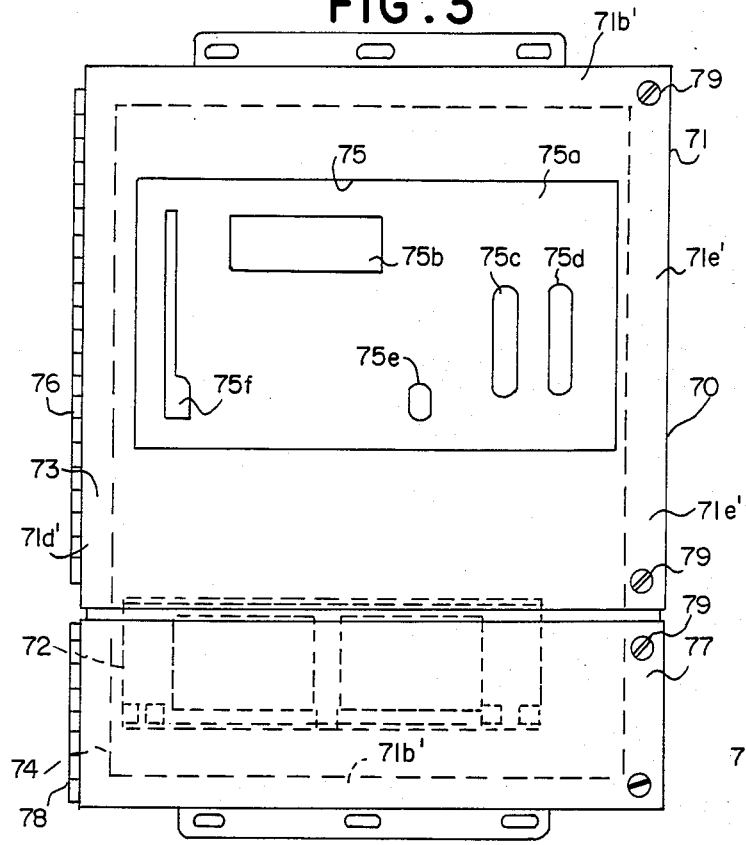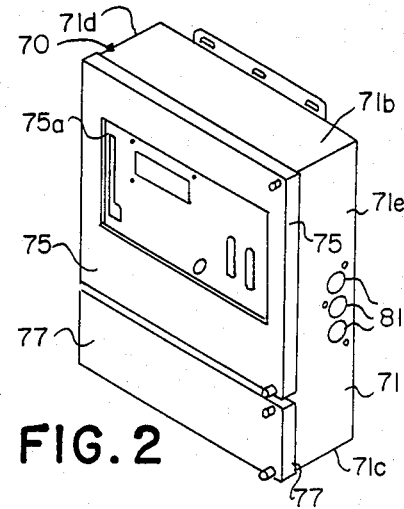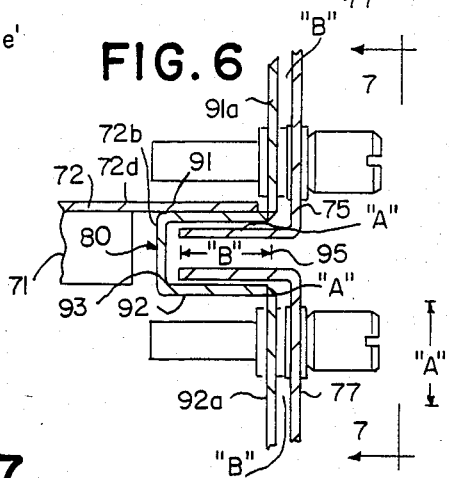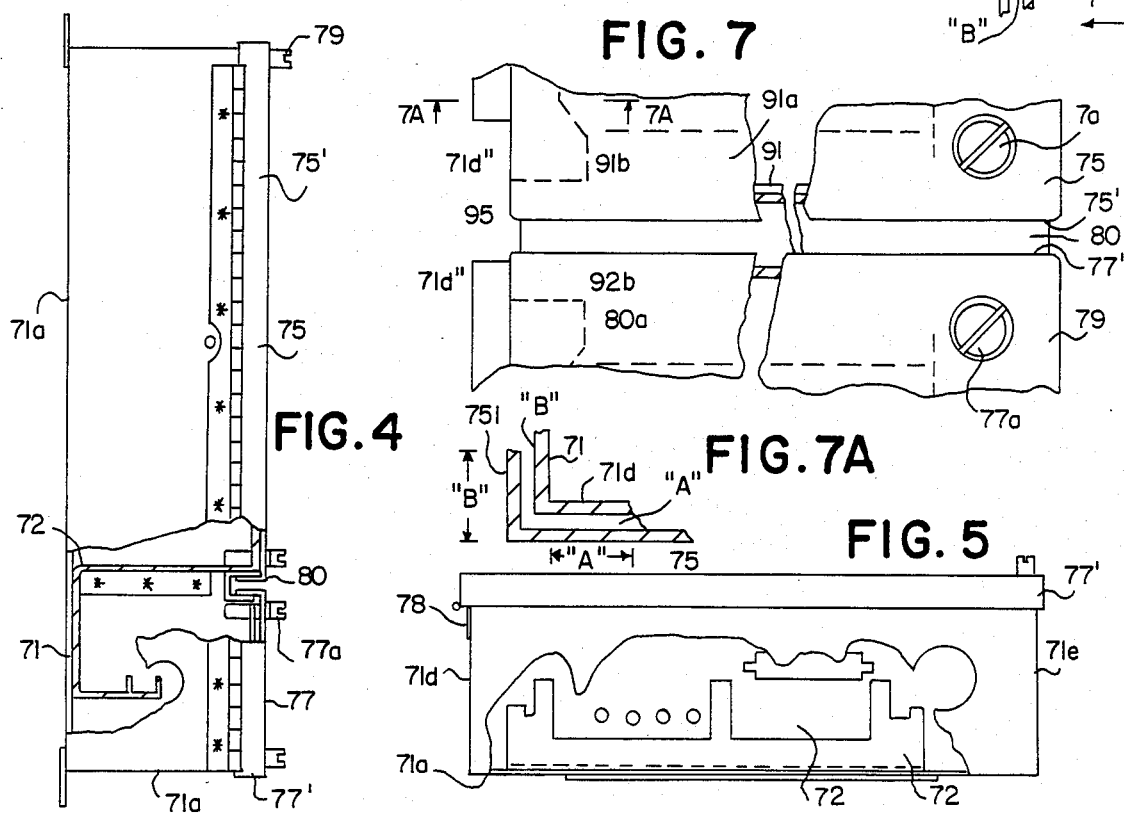

DIAGNOSTIC SYSTEM FOR COMBUSTION CONTROLLER

BACKGROUND OF THE INVENTION

This invention relates to combustion control systems, and more particularly to a diagnostic system for such combustion control systems.

Oxygen and combustibles analyzers are often used to analyze combustion gases in data collection and combustion control systems. These analyzers are effective in improving product quality and combustion efficiency as compared to systems without combustion gas analysis. A major drawback to these analyzers, however, is that the sampling, sensing, and heating systems required for their proper operation tend to be complex and prone to failure.

Current oxygen and combustibles analyzers provide little in the way of diagnostics to aid in system maintenance. As a rule, signals proportional to the oxygen and combustibles concentration in the analyzed gas are the only system outputs. Signals which represent internal analyzer condition are not provided as outputs. Correction factors based on the results of sensor calibration by automatic calibration systems are sometimes available. However, these correction factors are not easily accessible, and their meaning is not obvious to those without specialized knowledge.

These factors cause difficulty in interfacing the analyzer to a system controller. Because the basic operating conditions within the analyzer are unknown, erroneous flue gas measurements resulting from analyzer fault conditions may be used as control system inputs. Such erroneous inputs may result in inefficient and potentially unsafe conditions as the controller responds to them. A combustion control system using the output of a combustion analyzer as input could operate for significant periods of time based on false inputs. Thus, redundant measurements or complicated control systems were required. Thus, it would be desireable to have a combustion control system which monitors analyzer parameters and responds to abnormal conditions to default immediately.

A further consideration is the effects of electromagnetic and/or radio frequency interference (EMI/RFI) on control circuit operation. Such interference is generated by sources such as powerlines, rotating machinery, ignition systems, television and radio receivers, fluorescent lights, power amplifiers and transmitters of all types. Present combustion control systems generally comprise several packages each of which is environmentally sealed. Typically, the operator interface is located within the cabinet which houses the electronic control and processing circuitry and is accessed by a door. The only EMI/RMI protection is provided in the analyzer package to protect the low signal levels of the sensors and thermocouples. Typically, such protection is accomplished by shielding the cables which interconnect the several packages of the system by providing individual filters at the entrance of the housing for the electronic circuitry, and by providing conductive rubber gaskets on the door access for the housing. It would be desireable to have an improved housing for electronic control and processing circuitry of a combustion control system which minimizes its response to radio frequency and/or electromagnetic interference.

SUMMARY OF THE INVENTION

It is an object of the present invention to provide a more reliable combustion control system.

Another object of the invention is to provide a more reliable oxygen and combustibles analyzer.

Yet another object of the invention is to provide an improved diagnostic system for combustion control systems.

Another object of the invention is to provide a combustion control system including a combustion process sample analyzer and which continuously monitors parameters of the analyzer and detects predetermined abnormal conditions relating to operation of the analyzer.

A further object of the invention is to provide an improved packaging arrangement for apparatus for a combustion control system which minimizes its response to electromagnetic and/or radio frequency interference.

These and other objects are achieved by the present invention which has provided an improved combustion control system and packaging arrangement. The combustion control system includes a sensor assembly and a process controller assembly, the sensor assembly including at least one sensor for providing an output signal indicative of a parameter of the process. The process controller responds to the output signal to maintain a desired operation of the process.

In accordance with one aspect of the invention, the process controller continuously monitors parameters of the sensor and in the event any one of the parameters deviates from a setpoint value, the process controller provides an alarm indication for the operation.

In accordance with a further aspect of the invention, the process controller automatically prioritizes the system alarms an provides a display of only relevant alarms. By suppressing redundant alarms, trouble shooting is made easier because the operator is not required to recognize and ignore spurious information. Also, when an analyzer alarm is detected, the system automatically defaults the appropriate part of the control system to a known safe operating condition.

In accordance with another aspect of the invention, the process controller includes a housing designed to minimize the effects of radio frequency interference and electromagnetic interference on the operation of the process controller. In accordance with a feature of the invention, openings in the housing are sized to absorb or attenuate such interference to a safe level for system control.

The invention consists of certain novel features and structural details hereinafter fully described, illustrated in the accompanying drawings, and particularly pointed in the appended claims, it being understood that various changes in the details may be made without departing from the spirit, or sacrificing any of the advantages of the present invention.

DESCRIPTION OF THE DRAWINGS

For the purpose of facilitating and understanding the invention, there is illustrated in the accompanying drawings a preferred embodiment thereof, from an inspection of which, when considered in connection with the following description, the invention, its construction and operation, and many of its advantages will be readily understood and appreciated.

FIG. 1 is a block diagram of a combustion control system incorporating the diagnostic system of the present invention;

FIG. 1A is a plan view of the operator interface apparatus for the system shown in FIG. 1;

FIG. 1B is a sectional view taken along the lines 1B—1B of FIG. 1A;

FIG. 2 is an isometric view of a housing for the electronic circuitry of the system shown in FIG. 1;

FIG. 3 is a front elevational view of the housing;

FIG. 4 is a side elevation view of the housing partially cut away to illustrate the partition between the components compartment and the termination compartment and the sealing rail between the compartment doors;

FIG. 5 is an enlarged bottom plan view of the housing, partially cut away to illustrate the partition;

FIG. 6 is an enlarged view of a portion of the housing contained within the circuit indicated in FIG. 4;

FIG. 7 is a vertical sectional view taken along the line 7—7 of FIG. 6;

FIG. 7A is a horizontal sectional view taken along the line 7A—7A of FIG. 7;

DESCRIPTION OF A PREFERRED EMBODIMENT

Figure 8:
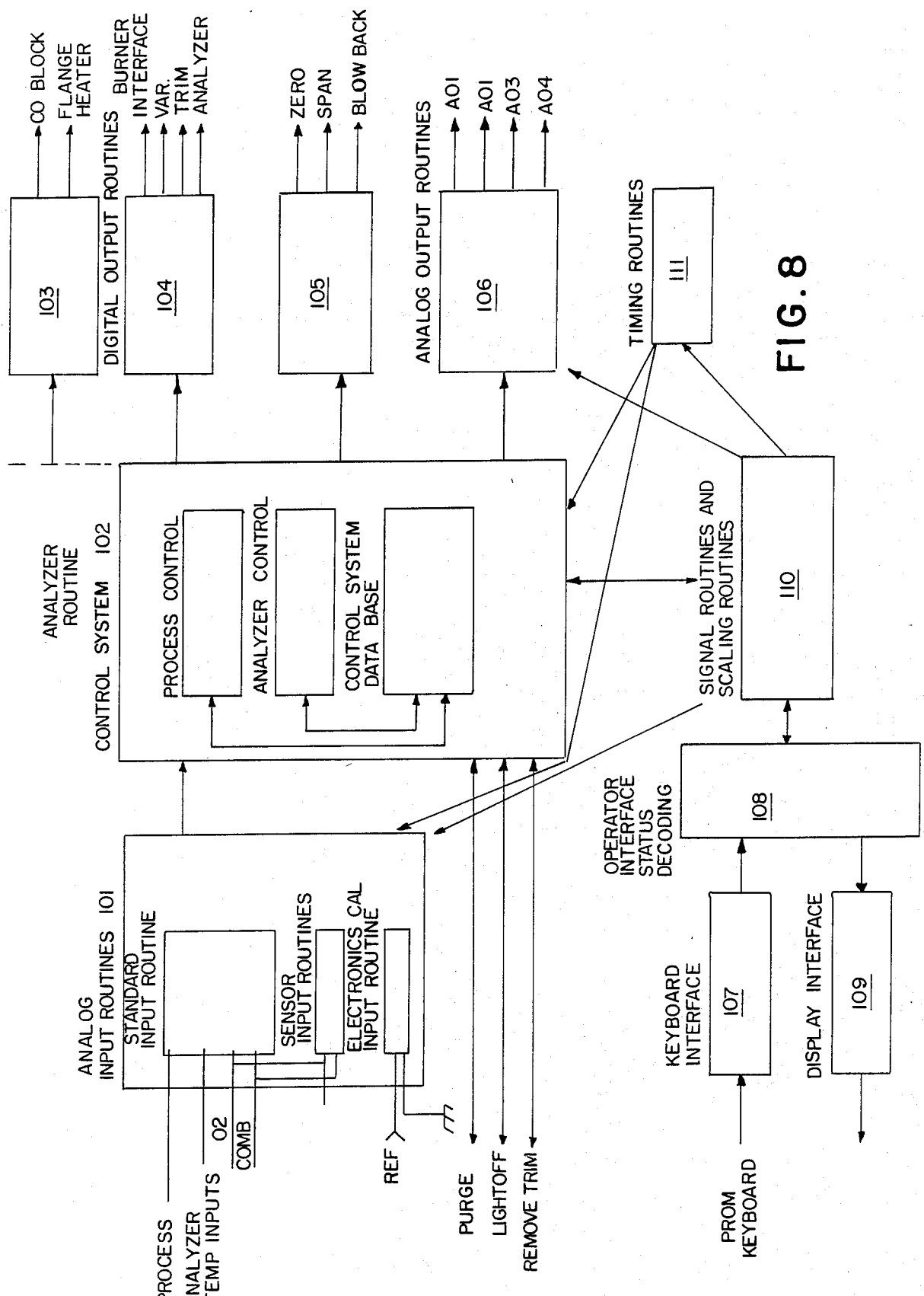
FIG. 8 is a block diagram illustrating the control programs of the system shown in FIG. 1.

Referring to FIG. 1, the combustion control system of the present invention is illustrated in block diagram form in FIG. 1. The combustion control system 10 maintains an optimum gas combustion by sampling flue gases and controlling the settings of a gas valve 10a and an air damper 10b as a function of process variables, including the percentages of oxygen and carbon monoxide in the flue gas, and system operating conditions.

The combustion control system 10 includes a sensor assembly 11 and a process controller 12, including electronic circuits, which are interconnected by a cable assembly 13, including conductors 13a–13h. The sensor assembly 11, which is located near the process being controlled, includes an oxygen sensor 14, a combustibles sensors 15 and a sensor probe (not shown) which is located in a duct (not shown) for extracting a sample of products of a combustion process for analysis. The sample is divided between the oxygen sensor 14 and the combustibles sensor 15 in a manner known in the art. The sensor assembly 11 includes an air powered aspirator (not shown) for drawing the sample from the process and across the two sensors 14 and 15. The analyzed sample is combined with the exhaust of the aspirator and dumped back into the exhaust stack of the process. The sample passing over the two sensors 14 and 15 generates an analog voltage in each sensor which is transmitted to the process controller 12 via conductors 13a and 13b of the interconnecting cable 13.

In addition to the analog signals representing the outputs of the two sensors 14 and 15, the sensor assembly provides to the electronic circuitry of the process controller 12 monitoring signals indicative of parameters or conditions of the sensors and/or hardware associated therewith. The sensor assembly includes a temperature sensor 16 providing an output indicative of the temperature of a flange manifold represented by block 14a on which the oxygen sensor 14 is mounted, a temperature sensor 17 providing an output indicative of the temperature of a mounting block represented by block 15a on which the combustibles sensor 15 is mounted. These parameter outputs are transmitted over conductors 13c and 13d respectively, from the sensor assembly 11 to the process controller 12. A further sensor 18 provides a process input, such as ambient temperature or pressure is supplied to the process controller 12 on conductor 13f.

In order to maintain the temperature of the sensors and sensor mountings at the required operating temperatures and above the dew point, the sensors are maintained at elevated operating temperatures by heating the support member 14a,15a on which the sensors are mounted. To this end, the sensor assembly 11 further includes a flange manifold heating device 19 and a combustibles block heating device 19a both of which receive control signals via conductors 13g–13h from the process controller 12.

A thermocouple 20 is used in controlling the process. A cold junction compensator, as it is called, is a thermally dependent current regulating device that accounts for the actual ambient temperature in the termination unit of the sensor assembly. This information is required for accuracy with any type of thermocouple used, and transmitted over conductor 13e to the process controller. A single cold junction compensator is used to compensate both for the process variable sensor 18, which is embodied as a thermocouple and the two parameter sensors, 16 and 17 used in the sensor assembly which sensors also comprise thermocouples.

The process controller 12 includes a multiplexing and signal conditioning circuit 21, an analog-to-digital converter circuit 22, a microprocessor 23, an operator interface 24 and output circuits 25 including a digital output interface 26, an analog output interface 27, and heater control circuits 28.

The multiplexing circuits 21 receive the analog signals provided by the sensor assembly 11 and the process input and extend them one at a time to the analog-to-digital converter circuit 22 which converts the signals to digital form for processing by the microprocessor 23. A suitable microprocessor 23 for this system is the Motorola Type 68HC11 which includes in addition to a digital signal processor, read only memory, random access memory, a programmable memory, a serial input/output port, and a timer system. The microprocessor monitors the analyzer status and initiates changes, particularly changes in temperature to maintain a desired status of the sensor assembly 11. The microprocessor compares the sensor signal levels received from the sensor assembly 11 with setpoint values and, based upon user input parameters, makes changes in settings of process apparatus (not shown), such as air damper controls, fuel valves, etc. to maximize the efficiency of the combustion process being monitored. The microprocessor also stores calibration information for maintaining the sensors in accurate and repeatable operating condition.

More specifically, the analog signals applied to the process controller 12 are sampled in a continuous, sequential manner by the multiplexing and signal conditioning circuits 21 which filter and amplify the signals before applying the signals to the analog-to-digital converter circuit 22. The analog signals are converted to digital form and applied to the microprocessor 23 which operates under program control to receive and process the digital inputs provided thereto by the analog-to-digital converter circuit 22 and to generate suitable control outputs which are applied via digital output interface 26 or analog output interface 27 to control apparatus. The control routines and diagnostic routines of the system will be described in more detail hereinafter.

In addition to the analog signals converted to digital form by the input section of the electronics circuit of the process controller 12 prior to processing by the microprocessor 23, the process controller 12 receives further inputs via operator interface 24 which enables the operator to input data, setpoint values and control commands to the system. The operator interface unit 24 also provides for the operator a display of information provided by the microprocessor, including alarm condition information, status information, etc. As will be shown, the process controller automatically prioritizes the system alarms which are displayed and provides a display of only relevant alarms. In other words, if a signal becomes invalid because of another alarm condition, alarms generated by that signal are not displayed to the operator. In addition, the operator interface unit 24 includes a plurality of status indicators which provide visual indication to the operator of various conditions of the system including the presence of an unacknowledged alarm.

Operator Interface

Referring to FIGS. 1 and 1A, the operator interface unit 24 comprises a membrane keyboard 31, an alphanumeric display 32, and a plurality of status indicators 33. The operator interface unit 24 is used to guide the operator through a series of simple tasks to configure the system to a specific application during initial startup. The liquid crystal display 32 and membrane keyboard 31 provide the operator with process information such as the concentrations of oxygen and CO and process temperature. The interface unit also informs the operator of faults discovered during periodic self diagnostic testing. The interface unit allows the system to be operated by non technical personnel by leading the operator through a series of simple steps for startup, calibration, and maintenance. The status indicators inform the operator of the current operating mode and status.

The system microprocessor 23 (FIG. 1) uses data from the operator interface in conjunction with internal control algorithms to determine the quantities of fuel and air that are required by the process and generate analog control signals which are used to control existing positioners for the fuel valve 10a and air damper 10b. The logging or display of process variables is supported by an analog output which can be used to output the value of a variable selected by the user.

The membrane keyboard 31 defines sixteen manually operable keys. A first group of keys used in setup of the system include a CAL key 34 and a TUNE key 35 and an ENTER key 36. A second group of keys are used by the operator in selecting screens, and information to be displayed. These include a NEXT SCREEN key 37, a SELECT key 38, an UP key 39 and a DOWN key 40. Further keys for operator control include a LIGHT key 41, a VAR key 42, an OXYGEN key 43, a COMBL key 44, and OUTPUT POSN key 45. The keyboard further includes a FUEL key 46, an AIR key 47 and a TRIM key 48, an ALARM ACK key 49. Depressing the CAL key 34 enters the calibration environment. This environment is used to calibrate the controller. Depressing the TUNE key 35 enters the tune environment. This environment is used to adjust the controller function as required by the process being controlled. Depressing the ENTER key 36 completes an option within a given screen. Depressing the NEXT SCREEN key 37 advances to the next screen within a given environment. This key is applicable only to the calibrate, tune, and alarm acknowledgement environments. Depressing the DOWN ARROW key 39 decreases the value of the selected parameter. Depressing the UP ARROW key 40 increases the value of the selected parameter. Depressing the VAR key 42 displays the value of the process variable input. The setpoint is also displayed, if appropriate. Depressing the OXYGEN key 43 displays the current oxygen level as measured by the system. The oxygen setpoint and the setpoint bias are also displayed. Depressing the COMBL key 44 displays the current combustibles level as measured by the system. The combustibles setpoint is also displayed. Depressing the OUTPUT POSN key 45 displays the current value of the system's control outputs. The state of each loop (either automatic or manual) is also displayed. Depressing the FUEL key 46 changes the state of the fuel control loop and displays the output position screen if applicable. Depressing the AIR key 47 changes the state of the air control loop and displays the output position screen if applicable. Depressing the TRIM key 48 changes the state of the trim control loop and displays the output position screen if applicable. Depressing the ALARM key 49 enters the alarm acknowledgement environment. This environment displays user defined and system alarms, if any exist. Depressing the LIGHT key 41 turns on the LCD display backlight. The backlight will automatically turn off if no keys have been depressed after five minutes.

The status indicators, which are embodied as light emitting diodes 50 and 50a are selectively lit to indicate when the FUEL AIR or TRIM keys 46-48 are activated in the automatic or manual mode of operation of the system, respectively. There are three sets of "MAN" and three "AUTO" LED indicators, 50 and 50a. One MANUAL LED and one AUTO LED are used to indicate the status of a given control signal. Thus, there are three sets of LED indicators, one for each key FUEL, AIR, and TRIM. The LED indicator 51 "ALARM" indicates that an alarm condition exists. The LED is energized intermittently to indicate that at least one alarm has not been acknowledged. The LED is energized steady to indicate that all alarms have been acknowledged. An acknowledged alarm is one which has been displayed on the systems LCD display. A further light emitting diode 52 is lit to indicate that a sensor calibration is in progress or that calibration gas is being inserted manually by the operator with the system functioning in the calibrate mode. A steady light indicates that a sensor calibration is in progress. A flashing light indicates that calibration gas is being inserted manually by the operator into the sensor assembly.

The membrane keyboard 31 includes a transparent window 53, with a liquid crystal display unit 32 (FIG. 1)

being located behind the transparent window 53. The window 53 seals the display unit environmentally in the housing 70 (FIG. 2) which encloses the process controller 12. The display unit 32 is a 20 character by four line unit which displays relevant process conditions and operating instructions. A pair of connectors 54 and 55 connect the display unit, the keys of the membrane keyboard, and the status light emitting diodes via respective ribbon conductors 54a and 55a to the electrical circuits of the process controller 12 mounted within the housing 70 (FIG. 2).

Component Housing

Referring to FIGS. 2–5, in accordance with a further aspect of the invention, the housing 70 which encloses the electronic circuits of the process controller 12 (FIG. 1) and the termination units of the system cable assembly 13 affords EMI/RFI protection for the system 10. The housing 70 includes an enclosure body 71, a partition 72 which divides the enclosure body into an enclosure portion 73 in the upper part of the enclosure body, and a termination portion 74 in the lower portion of the enclosure body. The enclosure body 71 includes a rear wall 71a, with top, bottom, left and right side walls 71b–71e extending at right angles to the rear wall, and each provided with its outer edge bent over defining respective flanges 71b′–71e′ shown in dashed lines in FIG. 3. The housing 70 further includes an enclosure door 75 mounted by way of a hinge 76 and locked in a closed position by screws 79 to enclose the enclosure portion 73 of the enclosure body and a termination door 77 mounted on the lower portion of the enclosure body by way of a hinge 78 and locked in a closed position by screws 79 for enclosing the termination portion 74 of the housing. The enclosure door 75 includes a generally rectangular shaped recessed portion 75a having a plurality of apertures 75b–75f therethrough. The enclosure door 75 also has a flange 75′ (FIGS. 2 and 4) defined by inwardly turned edges along its entire periphery. Similarly, the termination door 77 has an inwardly directed peripheral flange 77′. The housing 70 further includes a sealing rail 80 which bridges the gap between the lower edge of the enclosure door 75 and the upper edge of the termination door 77 as will be shown.

The electronic circuits of the process controller 12 (shown in block diagram form in FIG. 1) are mounted within the enclosure portion 73 of the housing 70 and the operator interface 24 shown in FIG. 1A, is mounted in the recessed area 75a on the forward outer portion of the enclosure door 75. Referring to FIGS. 1A, 1B, and 3, the membrane keyboard 31 is mounted externally of the housing for accessibility, and is sealed environmentally and protected from EMI/RFI by the transparent window 53 (FIG. 1A) with a shielding layer 31a (FIG. 1B) in the form of a conductive coating of graphite or aluminum overlying the top circuit layer 31b of the membrane keyboard. The transparent window 53 of membrane keyboard 31 is aligned with an aperture 75b in the recessed portion 75a of the enclosure door 75 to permit viewing of the liquid crystal display mounted therebehind. The window 53 is of a conductive material with a resistance of approximately 5 ohms per square inch, and may, for example, be Altair M-5 material. The window 53 is in electrical contact with the conductive layer 31a. The liquid crystal display unit is mounted behind the aligned window 53 and aperture 75b. The status lamps are mounted rearwardly of the keyboard in alignment with apertures 75c, 75d, 75e and 75f in the recessed portion 75a of the door enclosure 75 which in turn are aligned with corresponding translucent areas in the membrane keyboard. These areas may be color coded by way of graphics contained on a graphics layer 31c which defines the outer layer of the keyboard 31.

For the purpose of interfacing the electronic circuitry 12 (shown in block diagram form in FIG. 1) with system apparatus, including the sensors, the partition 72 mounts a connector (not shown) which is for example a 50 pin EMI/RMI protected type connector.

Referring to FIG. 2, three gas control valves (not shown) are mounted within the housing on the right side wall 71e of the enclosure body 71 with suitable connections (not shown) extendable through apertures 81 formed therethrough. Two of the valves are operable to supply zero calibration gas and span calibration gas to the analyzer. The third valve enables filter blow back.

All openings in the enclosure housing are sized to either absorb or attenuate EMI/RFI energy to a safe level for system control. For example, with reference to FIGS. 1, and 4–6, the peripheral flanges 75′ and 77′ of the doors 75 and 77 overlie the flanges 71b′–71e′ of the enclosure body 71. The sealing rail 80 cooperates with the housing enclosure body 71 and the termination door 77 and the enclosure door 75 to define openings of prescribed gaps which attenuate EMI/RFI energy.

In one embodiment of the housing 70 which was constructed, the enclosure body was 16.5 inches long, 12 inches wide, and 4.2 inches deep. The enclosure door 75 was 12.3 inches long, 11.84 inches wide and the flange 75′ extended 0.7 inches inwardly from the surface of door 75. The termination door 77 was 12.3 inches long, 4.08 inches wide and the flange 77′ extended inwardly 0.7 inches from the surface of the door. When the doors 75 and 77 were closed, the gaps between the door flanges 75′, 77′ and the enclosure body flange 71b′–71e′ were 0.035 inches wide. The overlap between the door flanges 75′, 77′ and enclosure walls 71b′–71c′ was 0.605 inches.

The sealing rail 80 includes a generally C-shaped center portion, including upper and lower flat planar rails 91 and 92 extending in parallel spaced relation the length of the enclosure body 71 and connected at their inner end by a vertically extending portion 93. The forward edges of rails 91 and 92 are bent at right angles defining upwardly extending flange portion 91a and downwardly extending flange portion 92a, respectively. The flange portions 91a and 92a terminate short of both ends of the rail defining a rectangular cutout, such as cutouts 91b and 92b (FIG. 7) which conform to the shape of enlarged end portions 71d″ of the enclosure body flange 71d′. The ends of sealing rail 80 are welded to the enclosure body, providing a weld seam at the forward and side edges of the enclosure body sidewalls and flanges. The sealing rail 80 is also connected to an undersurface 72a of a forwardly projecting portion 72b of the partition 72, such as by welding along the upper rail 91. The sealing rail 80 defines an inwardly disposed channel 95 extending laterally along the front surface of the enclosure body 71 at the intersection of the enclosure compartment 73 and termination compartment 74.

With reference to FIG. 7, the inwardly projecting flange portions 75′ and 77′ of the doors 75 and 77 are received in the slot 95 defined by the sealing rail. The flanges 75′ and 77′ are spaced apart from the surfaces 91a and 92a of the rails 91 and 92 defining gaps "A" therebetween. In addition, gaps "B" are defined between the inner surface of the doors 75 and 77 and forward surfaces 98 and 99 of the flanges 91a and 92a respectively. A portion of the flange 75′ of the enclosure door 75 overlaps a portion of rail 91 over length "A". Similarly, a portion of the flange 77′ of the termination door 77′ overlaps a portion of rail 92 over length "B". A portion of the flange 91a overlaps a portion of the enclosure door, and a portion of the flange 92a overlaps a portion of the termination door. The gaps "A" and "B" are at right angles to each other.

Referring to FIG. 7A, similar gaps "A" and "B" and overlapping portions of lengths "A" and "B" are provided between the enclosure housing and the enclosure door as shown in FIG. 7A, and also between the enclosure housing and the termination door. In one construction for the housing where gap "A" is 0.035 inches, and length "A" is 0.620 inches, the ratio of the overlap length to gap width is 17.7 to 1, and where gap "B" is 0.080 inches and length "B" is 0.605 inches, the length to gap ratio is 7.56. These ratios of the length of the overlap of the enclosure and door flanges to the width of the gaps therebetween are selected to attenuate EMI/RFI energy when the doors of the housing are closed.

Process Control Routines

Referring to FIG. 8, the process control routines reside in memory accessible to the microprocessor which executes the control algorithms in a logical fashion. The system is divided into eleven functional routines illustrated in block diagram form in FIG. 8 as including analog input routines 101, control system routines 102, and a plurality of output routines including analyzer control routines 103, digital output routines 104, solenoid digital output routines 105 and analog output routines 106. The process control routines further include a plurality of operator interface routines including keyboard interface routines 107, operator interface status and decoding routines 108, display interface routines 109 and signal and scaling routines 110. Timing routines 111 control the sequencing of operations. Process control routines suitable for these purposes are known in the art and do not form a part of the invention. However, the routines are described briefly for better illustrating the environment for the diagnostic system and interface control of the present invention.

The analog input routines 101 receive and process input signals from the process and the sensor assembly. There are separate routines dedicated to calibration of the sensors and of the hardware and for converting digital information from the A/D converter into proper engineering units for manipulation by the microprocessor and display to the operator. The sensor calibration input routines of the analog input routines 101 are part of the sensor autocalibration operation. The sensor signals are sampled for one minute while a known calibration gas flows across each sensor. These inputs are used to calibrate the oxygen sensor by correcting for inaccuracies and changes in the sensor output.

The control system routines 102 are common to analyzer and controller functions. These routines utilize a common data base, which is shared between the analyzer and controller functions. The control system routines 102 are comprised of known algorithms resident in memory and accessible to the microprocessor which executes these algorithms in a logical fashion. These algorithms have as variables, output signals from the analog routines 101, which have been converted into engineering units. The microprocessor then executes the following functions based on the results of these algorithms: controls process variable from a combustion process such as temperature or pressure; senses the oxygen and combustibles analog signals to control the process fuel/air ratio; controls internal operating temperatures used in the sensor assembly; and monitors and outputs to the operator the status of the system, i.e. purge, light off and remote trim.

The analyzer control routines 103 draw information from the controller section to control the energization of the heaters for the sensor mounting apparatus.

The digital output routines 104 draw information from the control system routine to provide the status of both the analyzer and the controller.

The solenoid digital output routines 105 control gas flow to the analyzer during a calibration cycle by operating the appropriate control valve to adjust zero setting, span and blowback.

The analog output routines 106 supply analog outputs used by either the controller or analyzer functions to provide control or to indicate current process conditions.

The keyboard interface routines 107 are used to poll the keyboard. Inputs from the keyboard can provide information to the process controller, the analyzer, or both.

The operator interface status decoding routines 108 determine the display status conditions and initiate the proper action required by signals input from the keyboard interface. These routines also regulate data flow sent to the display interface.

The display interface routines 109 control the information displayed as determined by the operator interface status decoding routines 108.

The signal scaling routines 110 communicate with the operator interface status decoding routines to determine the information flow within the analog input, control system section, and the analog output routines 106. Based upon the current configuration selected by the user, these routines regulate the flow of information between the analog input, control system and analog output routines. Also, depending upon the status of the operator interface status decoding routines, the signal scaling routines obtain information from the control system routines and transmit that information to the display interface.

The timing routines 111 regulate the autocalibration procedure. If the proper set of conditions exists, these routines enable the analog input and the control system routines to initiate the autocalibration cycle for the unit.

Referring again to FIG. 1, as previously indicated, the sensor assembly provides various signal inputs, including signals proportional to oxygen concentration, combustibles concentration, oxygen sensor block temperature, combustibles sensor block temperature, and a cold junction compensator used in conjunction with the thermocouples used for temperature measurement. The sensor assembly also contains heaters which are used to heat the sensors and the sample gas to predetermined, constant temperatures.

The signal inputs are then fed to an electronic circuits of the process controller 12 and are fed through multiplexer and signal conditioner 21 and an analog-to-digital converter 22. These signals are then manipulated by firmware resident in microprocessor 23. The results of these manipulations are made available to the user via operator interface 24. Much of this same information is made available to analog outputs and digital outputs. The analog outputs are used to provide a direct indication of measured parameters, whereas the digital outputs provide information on the status of a particular variable. Heater control circuitry is used to convert logic level signals from the microprocessor to the power levels needed by the sensor heaters.

Alarm Prioritization Routines

Figure 9:
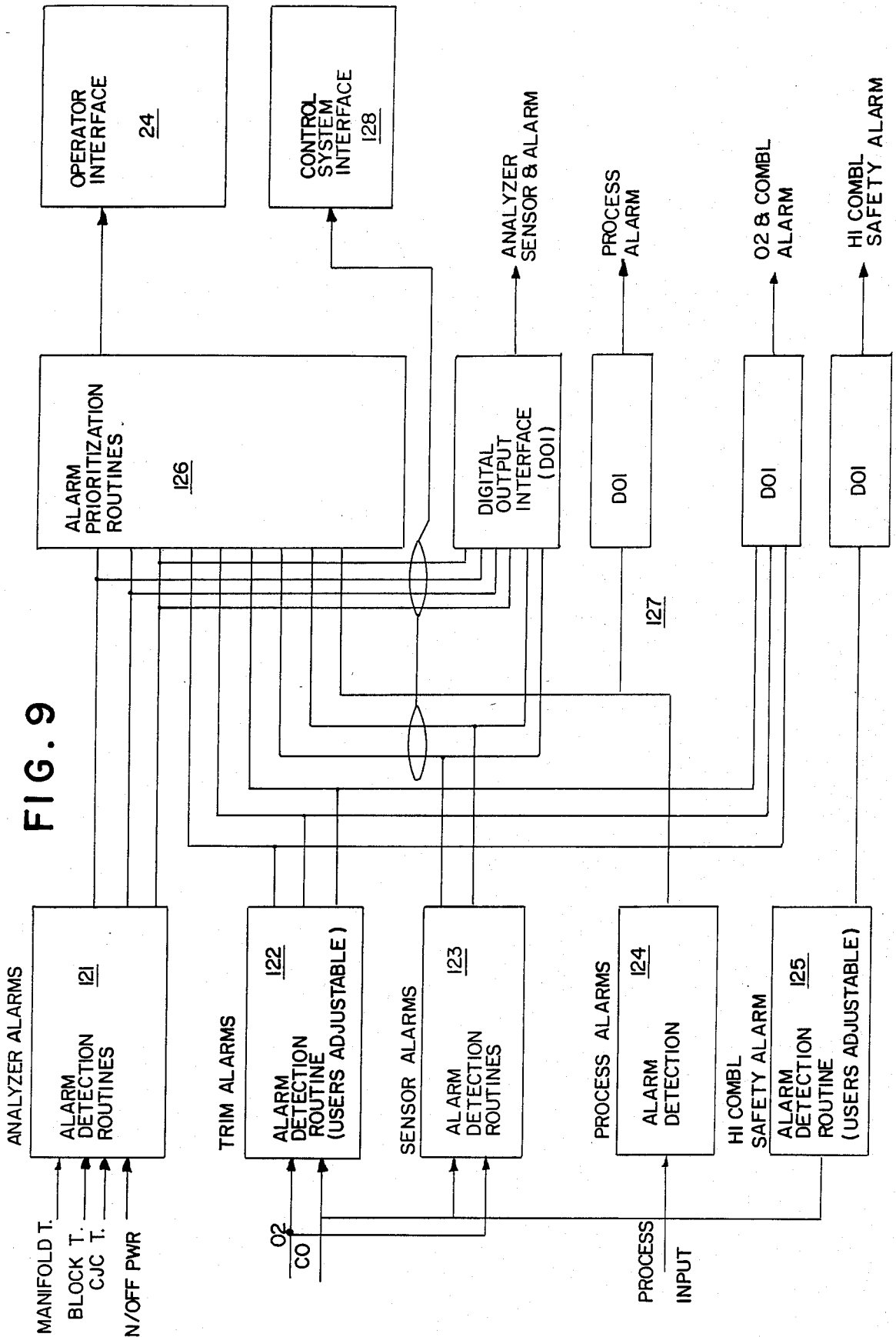
FIG. 9 is a block diagram illustrating alarm detection and prioritization routines for the system.

In accordance with another aspect of the invention, the information flow for the combustion control system 10 is shown in FIG. 9. Each measured variable is monitored by alarm detection and prioritization routines. These routines compare the measured variables with predetermined limits or setpoints and produce a digital output signaling alarm status. These alarms are classified into five types: analyzer alarms 121, trim alarms 122, sensor alarms 123, process alarms 124, and a high combustible safety alarm 125. Analyzer alarms and sensor alarms are predefined alarms. The trigger limits are preset according to known correct analyzer and sensor operating parameters. The other three types of alarms are dependent on the user's process, so they are user adjustable. These alarm indications are supplied to the alarm prioritization routines 126, to digital output interfaces 127, and to a control system interface 128.

The digital output interfaces 127 are grouped according to the type of alarm they represent. These outputs can be used to provide a highly visible indication of a system fault as well as a rough indication of the type of fault which exists. The high combustibles safety alarm can be used as a direct emergency fuel cutoff indication in cases where safe control of the process no longer exists.

Figure 10:
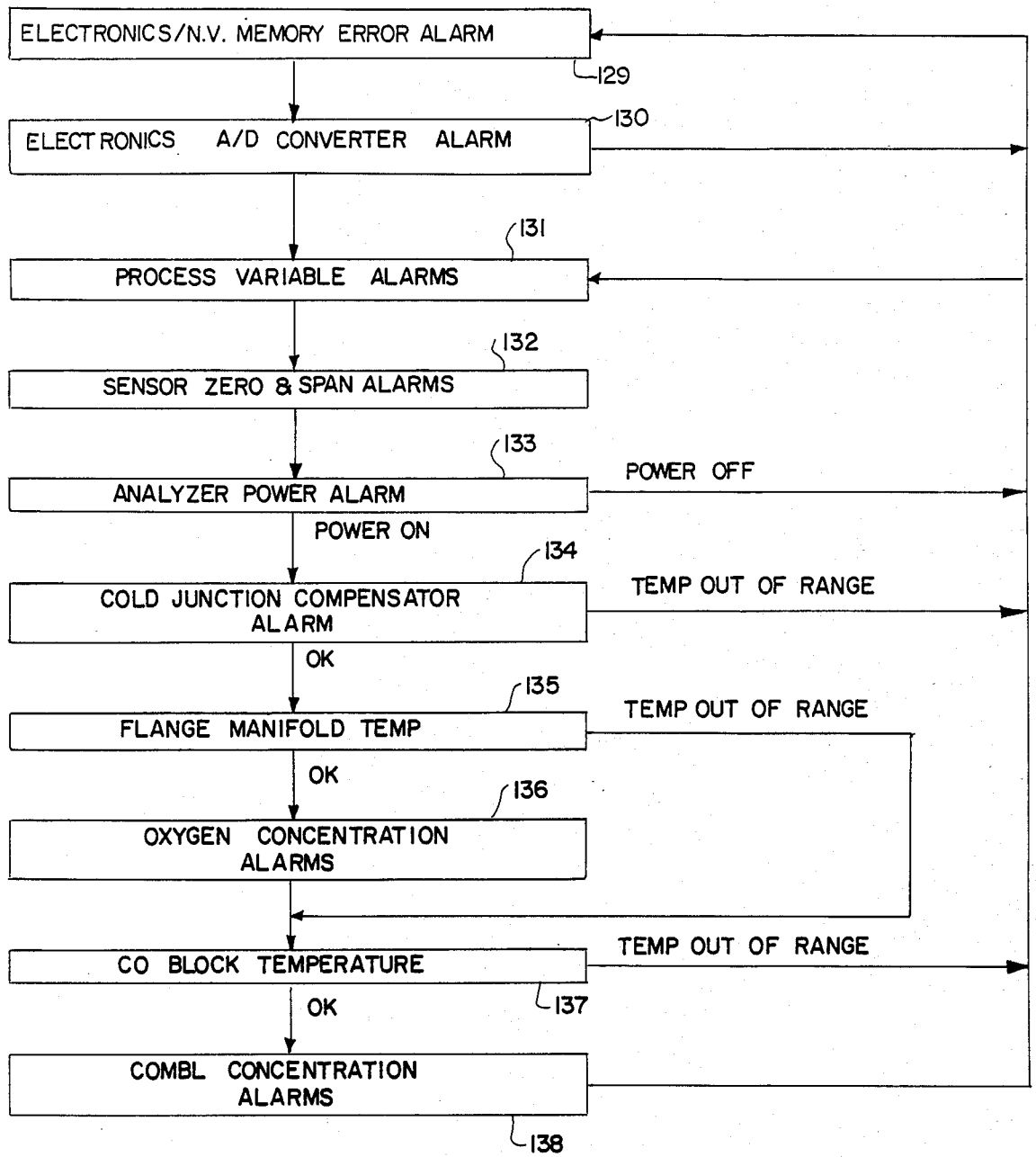
FIG. 10 is a diagrammatic representation of alarm priority status for the system.

The alarm prioritization routines 126 provide the operator with relevant information to aid in troubleshooting the fault. The prioritization routines present fault information based on priority as well as detailed knowledge of the analyzer system's internal operation. For example, there is a known relationship between the combustible block temperature and the accuracy of the combustibles sensor output. For this reason, the prioritization routines will not display a combustibles concentration alarm if the combustibles block temperature is known to be faulty. Thus, the operator is not required to determine causal relationships within the analyzer. Alarm priority ranking is illustrated in FIG. 10, and is established as follows:

1. Electronics non-volatile memory error alarm (block 129)
2. Electronics A/D converter error alarm (block 130)
3. Process Variable Alarms (block 131)
4. Sensor Zero & Span Alarm (block 132)
5. Analyzer Power Alarm (block 133)
6. Cold Junction Compensator (block 134)
7. Flange Manifold Temp. (block 135)
8. Oxygen concentration Alarm (block 136)
9. CO Block Temperature (block 137)
10. Combustibles Concentration alarm (block 138)

The prioritization of the alarms is a direct result of sensor assembly construction. There are known relationships between various parts of the system as described. Certain configuration and calibration information is stored in memory which retains its memory even after loss of power. This memory is referred to as Electrically Erasable Programmable Read Only Memory (EEPROM). Other technologies for achieving the same function do exist. If an EEPROM data error is detected (block 129), all inputs and configurations must be considered suspect, therefore, all other alarms are ignored. The same is true of an electronics A/D converter error (block 130). If the analog to digital converter malfunctions, inputs must once again be considered erroneous. Thus, any other errors are not displayed. Process variable alarms 131 reflect the state of the user's process. They are not necessarily affected by analyzer fault conditions, so they are always displayed.

Sensor zero and span alarms 132 for both the oxygen and combustible sensors are always displayed because the alarms are also not necessarily caused by other analyzer fault conditions.

The analyzer power alarm 133 has priority over any further alarms. If the power switch (not shown) is turned off, neither the cold junction compensator 18 (FIG. 1) or the sensor heaters (FIG. 1) have power. Thus, both a cold junction compensator alarm and a temperature alarm will occur as a direct result of turning off the power and are therefore redundant indications of a known condition.

The cold junction compensator 18 (FIG. 1) is an integrated part of the temperature measurement of both the flange manifold and the combustible sensor block. If the cold junction compensator fails, these temperatures will be erroneous, and the sensor outputs will be invalid. Therefore, the cold junction compensator alarm 134 has priority over the remaining alarms because if the cold junction compensator reading is invalid, the other alarms will occur as a direct result of this condition, and are therefore redundant.

If the flange manifold temperature is out of range, the oxygen sensor will be effected. Therefore, the flange manifold temperature alarm 135 has priority over oxygen concentration alarms. However, if the flange manifold temperature is within range, the oxygen concentration alarms are valid. These alarms represent process conditions and do not affect the combustibles block temperature or concentration alarms 137,138.

If the CO block temperature is out of range, the CO sensor outputs will be invalid. Thus, the combustibles concentration alarms 138 will be ignored.

Analyzer and sensor alarms are also fed automatically to the control system through the control system interface 128. This interface provides the control system with information which is necessary to disable the portions of the control system which are affected by fault conditions. Thus, proper operation of the control system when signal inputs are inaccurate is achieved. Operator identification and/or action based on these faults is not required to assure safe operation.

The system constantly monitors analyzer parameters and informs the control system of abnormal conditions. Thus, the control system can default immediately to a predetermined condition. The system automatically prioritizes analyzer alarms and displays only relevant alarms. These alarms are displayed in easy to understand English sentences. The digital outputs provide a remote indication of system status as well as an additional safety output. These outputs inform the operator of abnormal conditions. A more detailed explanation of these conditions is then available through the operator interface.

Multiple variables could be combined into one "SUPER" alarm. This alarm could then link to a single next alarm if the proper conditions are met, or it could link to several other alarms depending on the relationship between the variables being checked. Because certain relationships within the sensor assembly are fixed, an error in a given area is known to cause certain other errors.

In the system shown in FIG. 9, there is no prioritization shown among the digital outputs. For example, an O2 and COMBL trim alarm will cause a digital output to trip even if the alarm is a result of a sensor or analyzer alarm. It is apparent that the digital outputs can be prioritized in the same manner as the information to the screen.

Process flow charts for alarm processing routines are provided in FIGS. 11-14.

Figure 11:
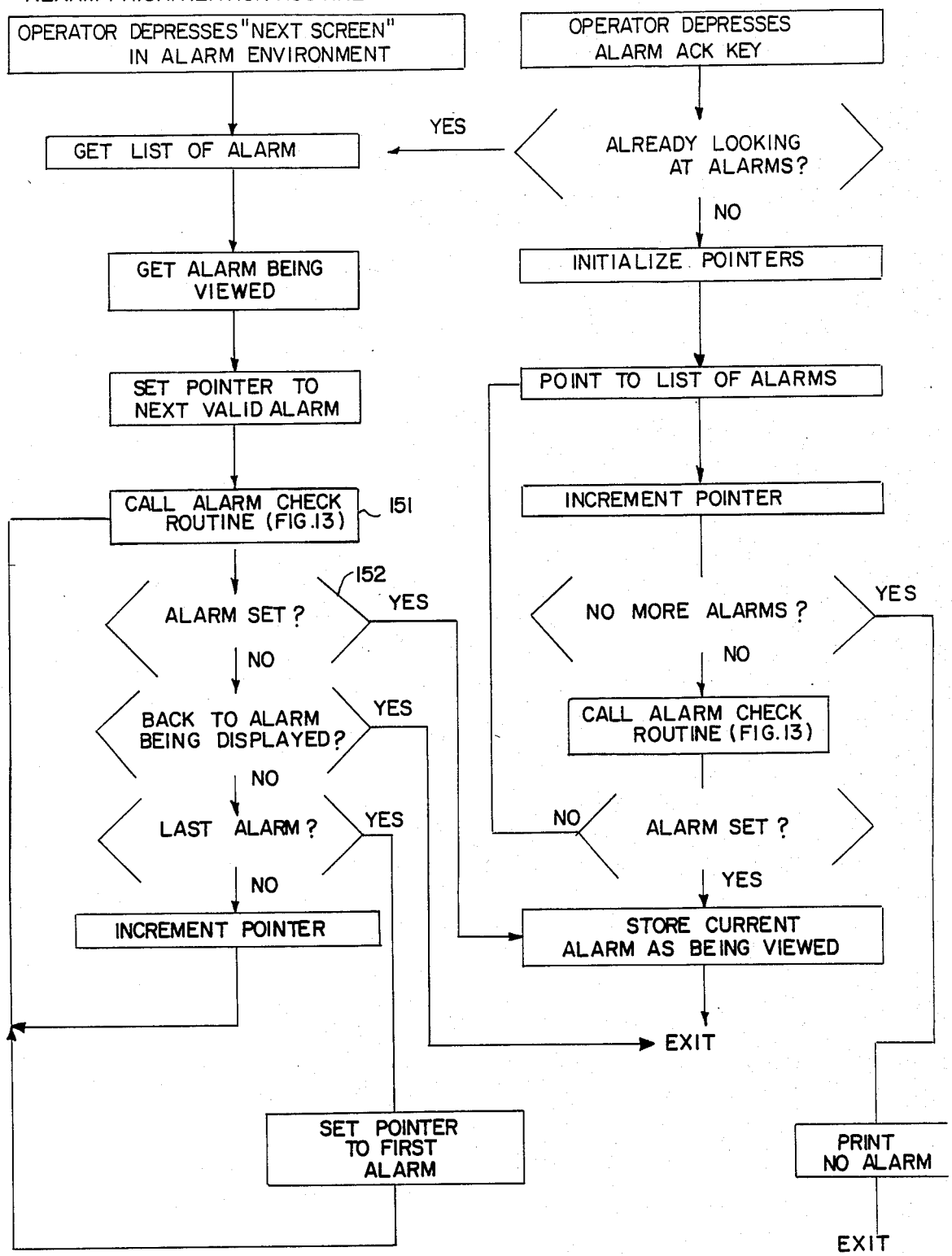
FIG. 11 is a process flow chart for the alarm prioritization routine.

Referring first to FIG. 11, in conjunction with FIG. 1A, whenever an alarm condition exists, the LED 51 is energized and flashes on and off to alert the operator of the existing alarm condition. The operator can view the status of current alarm conditions on the display 32 and can step from display to display by operating the appropriate keys alarm ACK 49 and NEXT SCREEN 37.

When the operator depresses the NEXT SCREEN key 37 in the alarm environment, the routine obtains the list of alarms, obtains the alarm being viewed and sets the pointer to the next valid alarm. The next valid alarm is the next alarm which can be displayed given the current alarm and the priority structure of the system. For example, with reference to FIG. 10, if the flange manifold temperature is out of range, the next valid alarm is the CO block temperature alarm.

The alarm check routine (FIG. 13) is then called and if the alarm is set, the alarm is displayed and the fact that the alarm is currently being displayed is stored in memory. If the alarm is not set, the routine increments through the list of alarms and continues through the loop. If the last alarm in the list of alarms has been checked, the pointer is returned to the beginning of the list of alarms. Checking then continues. The loop is exited through one of two means. If another valid alarm is found (see blocks 151,152), the alarm is displayed. If the entire list of alarms has been checked and the alarm which is currently being displayed is the only valid alarm, no action is taken and the loop is exited.

If the operator depresses the alarm acknowledge key, the alarm acknowledge routine (FIG. 12) is executed and the routine then determines if alarms are currently being looked at. If not, the pointers are initialized, the list of alarms is pointed to, and the pointer is incremented. The alarm check routine (FIG. 13) is called, under supervision of the pointer, to determine if any alarms are set. If at this time there are no alarms, then the phrase "no alarm" is displayed on the display unit 32. If there is an alarm, the alarm message is sent to the display.

Figure 13:
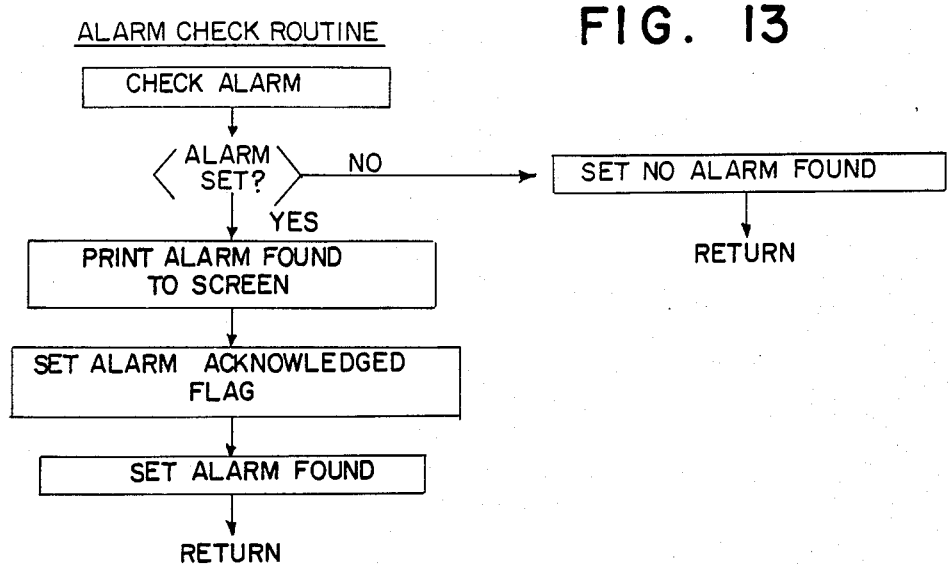
FIG. 13 is a process flow chart for the alarm check routine.

Referring to FIG. 13, in the alarm check routine, if an alarm i set, a message identifying the alarm found is displayed on the display unit 32, the alarm acknowledged flag is set and the alarm found is set. The program then returns to the main stream. If the alarm is not set, the condition no alarm found is set and the program returns to the main stream.

Figure 14:
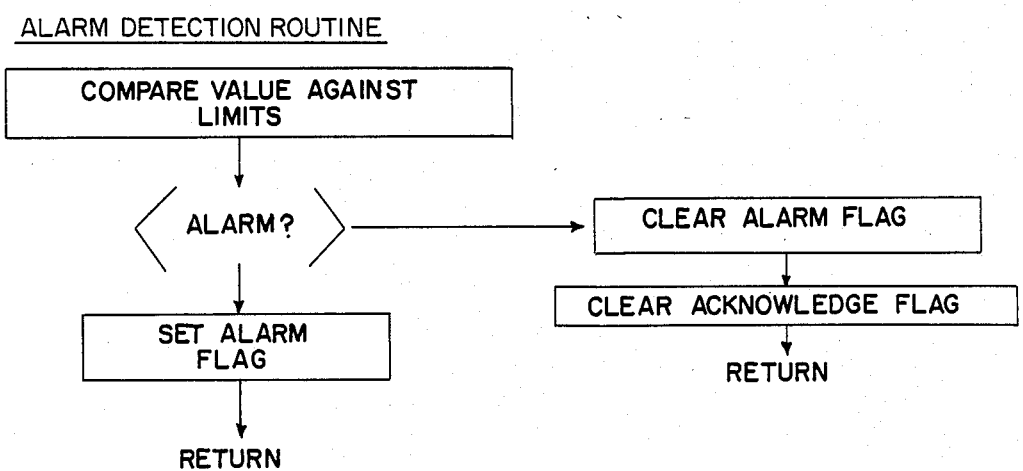
FIG. 14 is a process flow chart for the alarm detection routine.

The alarm detection routine, illustrated in FIG. 14, compares the value of an incoming parameter against the setpoint limits and if there is an alarm condition, the alarm flag is set. If no alarm condition exists, the alarm flag is cleared, the alarm acknowledged flag is cleared and the program returns to the main stream.

Figure 12:
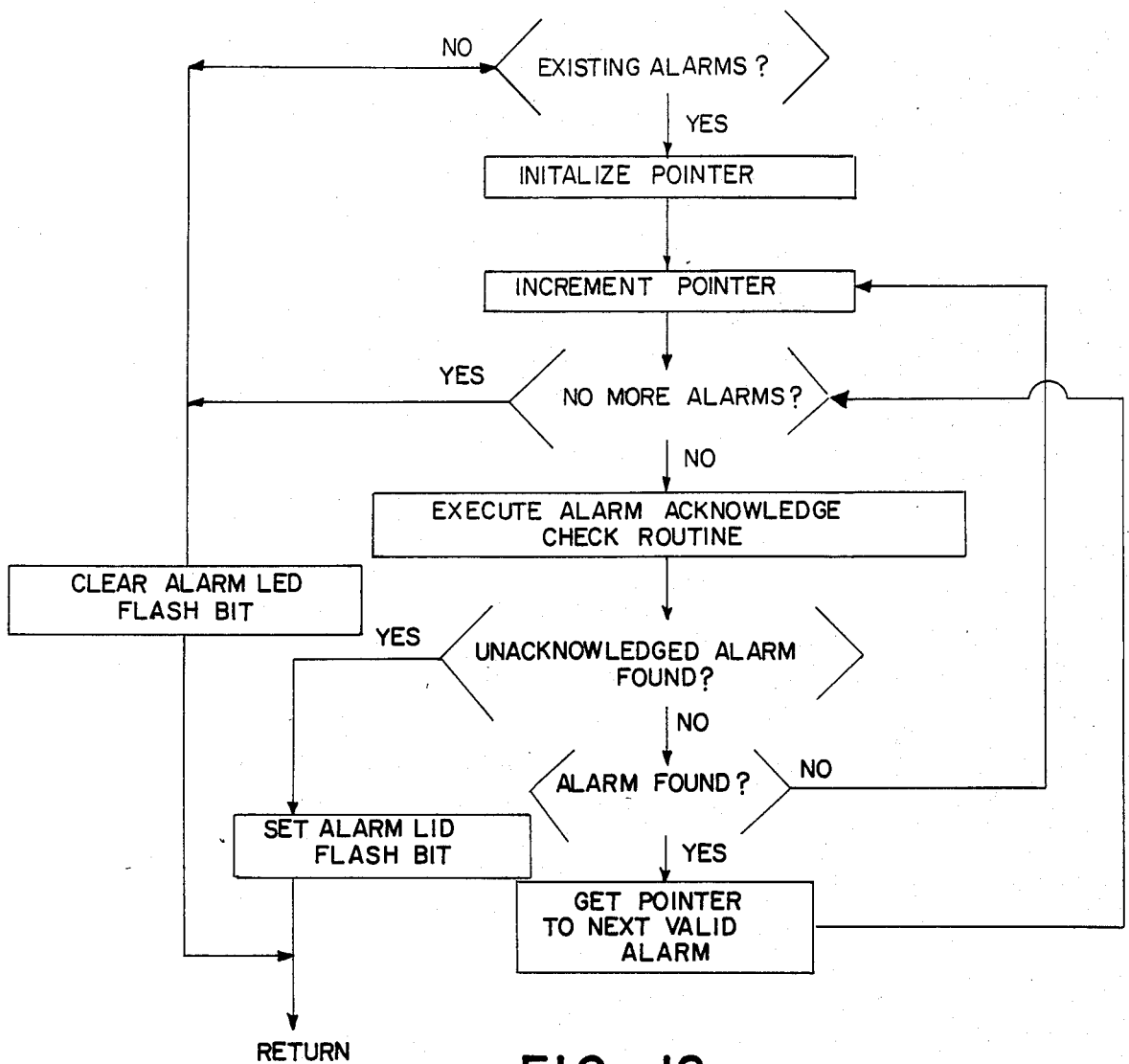
FIG. 12 is a process flow chart for the alarm acknowledge routine.

Referring to FIG. 12, whenever the alarm acknowledged key 49 is depressed, the alarm acknowledged routine is executed. If there is an existing alarm, the pointer is initialized. Then the pointer is incremented and if there is another alarm, the alarm LED flash bit is set. If there are no more alarms, then the alarm acknowledged check routine is executed and if an unacknowledged alarm is found, the alarm LED flash bit is set. Otherwise, if any alarm is found the pointer is set to the next valid alarm. Otherwise, the routine loops back to increment the pointer and search for any further alarms.

We claim:

1. In a combustion control system including a sensor assembly having sensor means for providing an output signal indicative of at least one parameter of the process, a process controller means comprising: input means for receiving the output signals provided by the sensor means, processing means for processing the signals and generating control outputs to maintain a desired operation of the process, said signal processing means including monitoring means for continuously monitoring parameters of the combustion control system including parameters of the sensor means and generating an alarm signal whenever any one of the parameters deviates from a setpoint value, display means controlled by said signal processing means for displaying alarm conditions, and said signal processing means including prioritization means for automatically prioritizing the alarms to provide a display of select alarm conditions based on detailed knowledge of internal operations of an analyzer system which is a direct result of a construction of said analyzer system, and the combustion control system and said prioritization means disregard suspect sensor readings through a program contained in a memory of the combustion control system.

2. A combustion control system according to claim 1, wherein a first group of the monitored parameters are predefined in terms of correct operation of the sensor assembly, and a second group of said parameters are selectable as a function of operating modes for the combustion control system, and further comprising user interface means coupled to said signal processing means to enable the user to apply to said signal processing means selected setpoint values for said second group of parameters.

3. A combustion control system according to claim 2, wherein said prioritization means causes a display of an alarm condition for deviation of any one of the parameters of said first group from respective setpoint values and suppresses display of an alarm condition for any one of the parameters of said second group in the presence of an alarm condition for any one of the parameters of said first group.

4. A combustion control system according to claim 3, wherein said prioritization means controls said user interface means to display certain ones of said alarm conditions on said display means and generates alarm signals corresponding to other ones of said alarm conditions for application to a control system interface to effect adjustment in system operation in accordance with the alarms being generated.

5. A combustion control system according to claim 3, said sensor means includes a plurality of sensors and wherein said prioritizations means responds to an alarm signal indicative of a failure condition for a given one of said sensors to suppress the display of an alarm condition indicative of deviation from the setpoint value of the parameter monitored by said one sensor and to apply said alarm signal to a control system interface to effect transfer of system operation to a known safe condition.

6. A combustion control system including a sensor assembly having at least first and second parameter sensor means each providing output signals indicative of different parameters of the process, a process controller means comprising: input means for receiving the output signals provided by the first and second parameter sensor means, signal processing means for processing the signals and generating control outputs to maintain a desired operation of the process, said signal processing means including monitoring means including component sensing means for continuously monitoring operating conditions of the first and second sensor means and generating an alarm signal whenever a process parameter or a sensor operating condition deviates from a setpoint value, and user interface means coupled to said signal processing means and including display means controlled by said signal processing means for displaying the alarm conditions, and said signal processing means including prioritization means for automatically prioritizing the alarm conditions to provide a display of select alarm conditions based on detailed knowledge of internal operations of an analyzer system which is a direct result of a construction of said analyzer system, and the combustion control system and said prioritization means disregard suspect sensor readings through a program contained in a memory of the combustion control system.

7. A combustion control system according to claim 6, wherein said user interface means includes a keyboard, and wherein the system parameters are predefined, and wherein process alarms and trim alarms which are a function of the process being controlled have their limits user adjustable via said keyboard based on the user's knowledge of the process.

8. A combustion control system according to claim 7, wherein said prioritization means causes a display of an alarm condition for deviation of any one of said system parameters from its respective setpoint value and suppresses display of an alarm condition for any one of said sensor operating conditions in the presence of an alarm condition for any one of said system parameters.

9. A combustion control system according to claim 7, wherein said prioritization means causes display of an indication of an alarm condition for process parameters whenever they occur and said prioritization means causes display of an indication of an alarm condition for a sensor operation condition only in the absence of an alarm condition for a process parameter.

10. In a combustion control system including a sensor assembly having sensor means for providing an output signal indicative of at least one parameter of the process, a process controller means comprising: input means for receiving the output signals provided by the sensor means, processing means for processing the signals and generating control outputs to maintain a desired operation of the process, said signal processing means including monitoring means for continuously monitoring parameters of the combustion control system including parameters of the sensor means and generating an alarm signal whenever any one of the parameters deviates from a setpoint value, display means controlled by said signal processing means for displaying alarm conditions, and signal processing means including prioritization means for automatically prioritizing the alarms to provide a display of only relevant alarm conditions;

a first group of the monitored parameters predefined in terms of correct operation of the sensor assembly, a second group of said parameters selectable as a function of operating modes for the combustion control system, user interface means coupled to said signal processing means to enable the user to apply to said signal processing means selected setpoint values for said second group of parameters;

said prioritization means causing a display of an alarm condition for deviation of any one of said parameters of said first group from respective setpoint values and suppressing display of an alarm condition for any one of the parameters of said second group in the presence of an alarm condition for any one of the parameters of said first group; and certain ones of the parameters of said first group being internal system variables and said prioritization means causing display of an alarm condition whenever the certain parameters deviate from setpoint values; a further parameter of said first group being indicative of application of power to at least said sensor assembly, said prioritization means causing display of an alarm condition whenever power is not applied to said sensor assembly and wherein the parameters of the second group are indicative of conditions of the sensor, said prioritization means causing display of their alarm conditions only in the absence of alarm conditions for all parameters of said first group.

11. In a control system including a sensor assembly having sensor means for providing an output signal indicative of at least one parameter of the process, a process controller means comprising: input means for receiving the output signals provided by the sensor means, signal processing means for processing the signals and generating control outputs to maintain a desired operation of the process, said signal processing means including monitoring means for continuously monitoring parameters of the combustion control system including parameters of the sensor means and generating an alarm signal whenever any one of the parameters deviates from a setpoint value, display means controlled by said signal processing means for displaying the alarm conditions, and said signal processing means including prioritization means for automatically prioritizing the alarm conditions to provide a display of only relevant alarm conditions; and a first group of the monitored parameters predefined in terms of correct operation of the sensor assembly, and a second group of said parameters selectable as a function of operating modes for the control system, and further comprising user interface means coupled to said signal processing means to enable the user to select setpoint values for said second group of parameters, said prioritization means causing a display of an alarm condition for deviation of any one of the parameters of said first group from respective setpoint values and suppressing display of an alarm condition for any one of the parameters of said second group in the presence of an alarm condition for any one of the parameters of said first group.

* * * * *